United States Patent

Shiley et al.

[11] Patent Number: 5,573,409
[45] Date of Patent: Nov. 12, 1996

[54] INTERCONNECTOR

[75] Inventors: Robert J. Shiley, Riverside; Gary C. Bethurum, Laguna Niguel, both of Calif.

[73] Assignee: ITT Corporation, Secaucus, N.J.

[21] Appl. No.: 777,290
[22] PCT Filed: Nov. 17, 1991
[86] PCT No.: PCT/US91/07660
  § 371 Date: Dec. 12, 1991
  § 102(e) Date: Dec. 12, 1991
[51] Int. Cl.⁶ .................................................... H01R 31/06
[52] U.S. Cl. ............................................ 439/76.1; 439/67
[58] Field of Search ......................... 439/67, 77, 638, 439/651–654, 76.1; 361/749–751

[56] References Cited

U.S. PATENT DOCUMENTS

| | | | |
|---|---|---|---|
| 3,378,920 | 4/1968 | Cone | 29/625 |
| 3,644,661 | 2/1972 | Asar et al. | 174/68.5 |
| 3,705,378 | 12/1972 | Elkins | 339/156 |
| 3,970,802 | 7/1976 | Nijman | 361/778 |
| 4,143,932 | 3/1979 | Boutros | 339/17 |
| 4,329,008 | 5/1982 | Braginetz | 339/217 |
| 4,418,239 | 11/1983 | Larson et al. | 174/34 |
| 4,592,614 | 6/1986 | Myers, Jr. | 339/154 |
| 4,618,196 | 10/1986 | Muzslay | 339/17 |
| 4,781,625 | 11/1988 | Yang | 439/654 |
| 4,793,058 | 12/1988 | Venaleck | 29/845 |
| 4,815,990 | 3/1989 | Ristedt et al. | 439/496 |
| 4,857,002 | 8/1989 | Jenson et al. | 439/76 |
| 4,954,089 | 9/1990 | Jenson et al. | 439/76 |
| 4,993,958 | 2/1991 | Trobough et al. | 439/91 |
| 5,080,609 | 1/1992 | Fabian et al. | 439/67 |
| 5,227,955 | 7/1993 | LeBris et al. | 439/622 |

FOREIGN PATENT DOCUMENTS

| | | | |
|---|---|---|---|
| 2-112184 | 4/1990 | Japan | 439/79 |
| 2-170495 | 7/1990 | Japan | 361/749 |

*Primary Examiner*—Neil Abrams
*Attorney, Agent, or Firm*—Thomas L. Peterson

[57] ABSTRACT

A connector is described, of the type that has rows of contacts at each of its opposite mating face, with each contact at one face connected to a contact at the other face. In a connector that has at least three rows of contacts at each face, the contacts are connected through a flexible circuit board arrangement that has circuit board conductors. First and second groups of conductors (70, 76 in FIG. 4) that connect rows at the opposite faces extend in a zig-zag pattern along a first face of the flexible circuit board. A third group of conductors (84, FIG. 5) extend along a second face of the circuit board. The flexible circuit board has first and second end portions connected to the contacts and has a middle therebetween, with the middle (114, FIG. 2) curved along substantially half a cylinder around one side (110) of a spacer (66).

6 Claims, 6 Drawing Sheets

INTERCONNECTOR

BACKGROUND OF THE INVENTION

A common type of connector that has opposite faces and rows of contacts at each face, is a gender reversal connector. Such connector can be used to connect the ends of two cables that cannot be connected together either because they are both male or both female or their ends do not fit one another. Connectors with rows of contacts at opposite faces, can also be used to connect selected contacts at one end to selected contacts at the other end, with or without signal processing components in between. Older gender reversal connectors with two rows of contacts have used flexible circuit boards with conductors on a board surface connecting together pairs of contacts at the opposite faces of the connector. A more recent gender reversal contact, described in U.S. Pat. No. 4,618,196 entitled "Gender Reversal Connector" by Muzslay has described a simplified gender reversal connector which does not require a circuit board. However, more recent requirements for connectors with at least three rows of contacts have prevented the use of such simplified gender reversal connector without a circuit board.

A connector with rows of contacts at its opposite faces, wherein there were at least three rows of contacts at each face, which enabled interconnection of the contact despite their close spacing along each row, would be of considerable value. A connector with rows of contacts at its opposite faces, which used a flexible circuit board to connect the two sets of rows of contacts, which enable the connector to be compact and the circuit board to be securely held in place, would also be of considerable value.

SUMMARY OF THE INVENTION

In accordance with one embodiment of the present invention, a connector is provided of the type that has rows of contacts at its opposite faces, which is compact and versatile. Where a gender reversal connector is required, that has at least three rows of contacts at its opposite faces, a flexible circuit board is used which has conductors connecting terminations at its opposite board end portions. The conductors on one face of the circuit board extend in zig-zag patterns around the terminations of other rows, to enable the terminations to be closely spaced along each row. Another group of conductors extends along the opposite second face of the flexible circuit board, with each termination including a plated-through hole.

A flexible circuit board assembly is securely held in position, in a compact arrangement, by the use of a spacer about which the flexible circuit board is wrapped. The circuit board assembly has first and second opposite end portions, and has a middle that is wrapped in a substantially 180° cylindrical loop around one edge of the spacer. The flexible circuit board can be held to the spacer by adhesive. Each end of the flexible circuit board can have a stiffener plate thereon which securely holds a contact that is electrically connected to a termination on the board. Where complex interconnections are provided along the board, additional room is provided along the flexible circuit board by wrapping it in an S-shape that includes two U-shaped loops each extending about a separate spacer.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
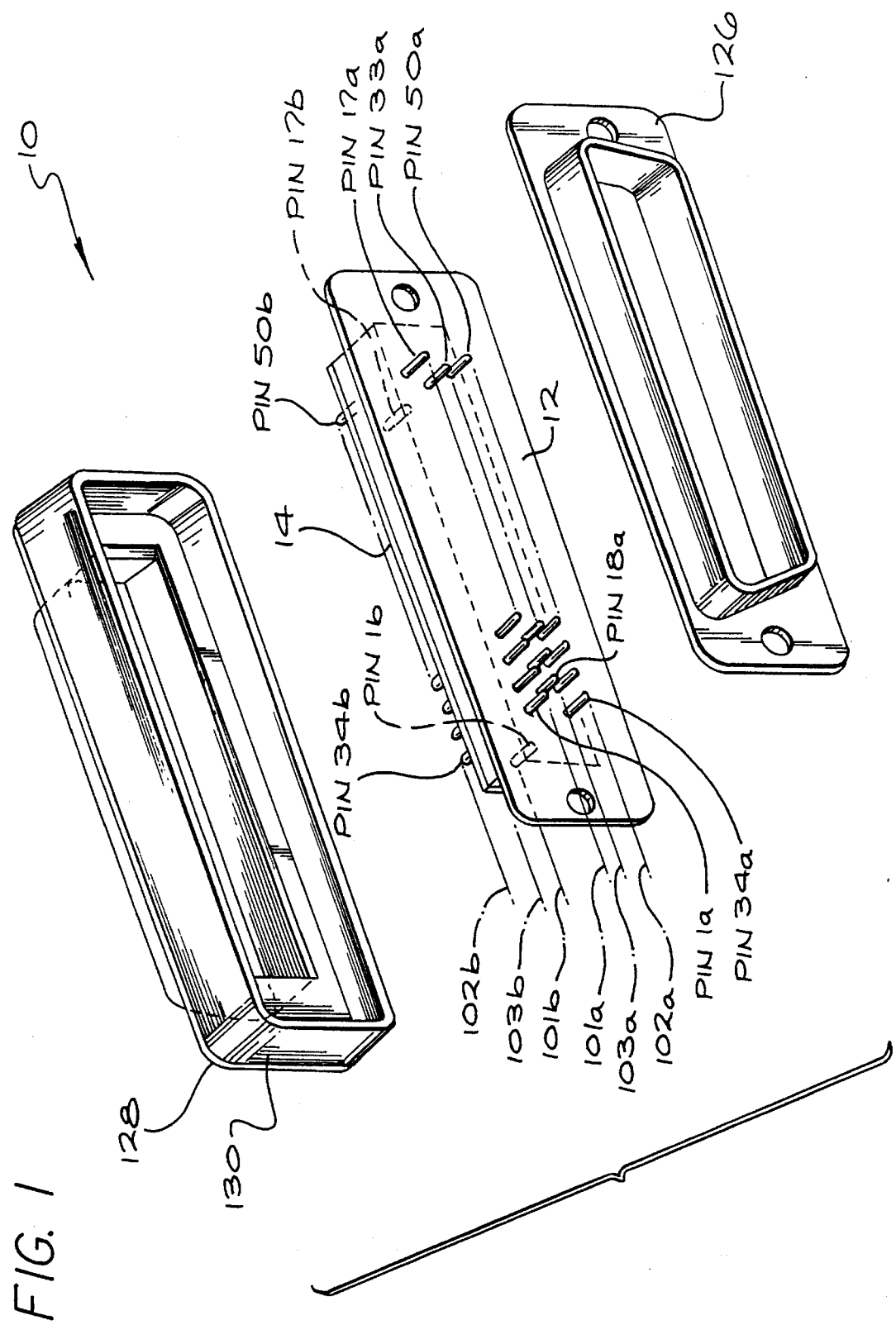
FIG. 1 is an exploded perspective view of a connector constructed in accordance with one embodiment of the present invention.
Figure 2:
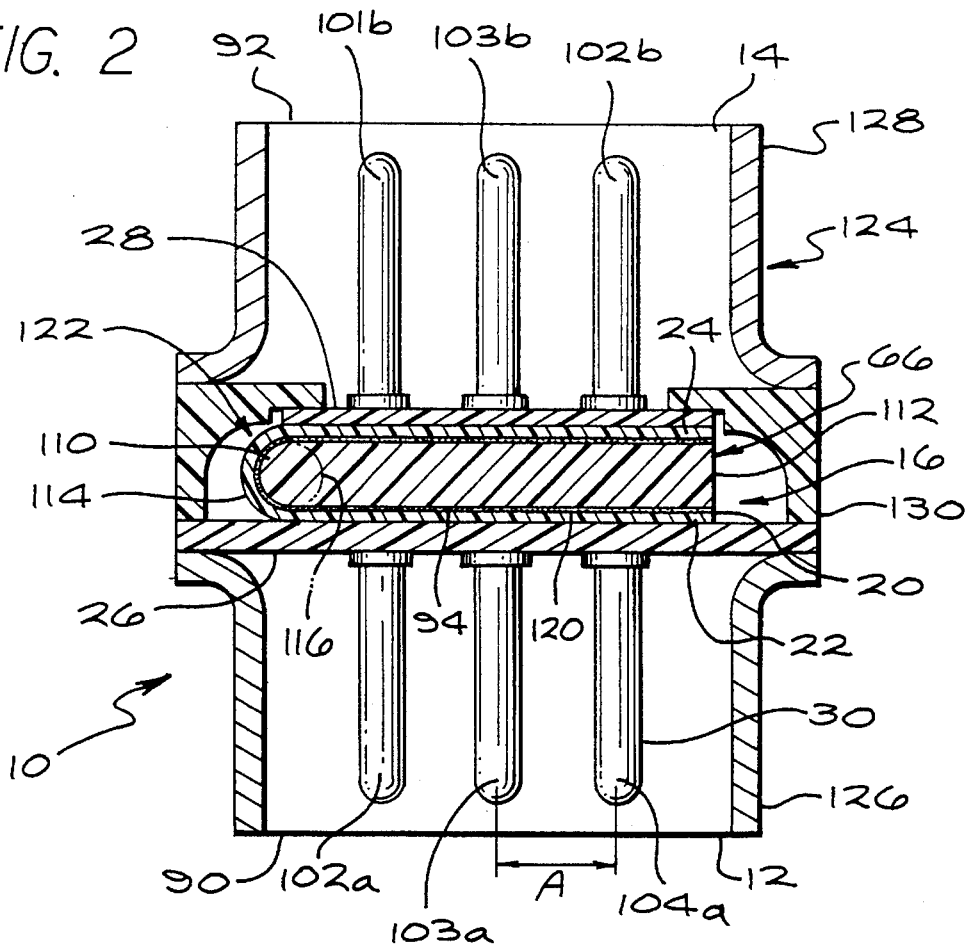
FIG. 2 is a sectional view of the connector of FIG. 1.

FIGS. 1 and 2 illustrate a connector 10 which includes first and second mating face parts or faces 12, 14. Each face includes three rows of contacts, with the first face having the three rows 101a, 102a, and 103a, and the other face having three corresponding rows 101b, 102b, and 103b. The connector is a gender reversal connector, in that the ends of two mating plugs that each have socket contacts, can be connected together through the connector 10. Such plugs would be plugged into opposite faces, with one plug at one face such as 14 being upside down with respect to the other plug plugged into the face 12. Such upside-down arrangement simplifies the circuity interconnecting the contacts, and such upside-down arrangement is described in U.S. Pat. No. 4,618,196. As a result of this arrangement, pin 1a on face 12 is connected to pin 1b on face 14, while pin 34a on face 12 connects to pin 34b on face 14. Where connectors of small profile are required that have many contacts, the connectors are sometimes constructed with three or more rows of closely-spaced contacts. Applicant uses a flexible circuit board assembly 16 to connect each pin of one row such as 101a to a corresponding pin in a corresponding row such as 101b at the other face of the connector.

The flexible circuit board assembly 16 includes a flexible circuit board 20 with opposite end portions 22, 24 at the opposite mating face parts 12, 14. A stiffening plate 26, 28 is attached to each end portion 22, 24. Pin contacts 30 which are arranged in the two groups of three rows each, are each steadied in position by the corresponding stiffening plate 26, 28, and are each electrically connected to terminations on the circuit board 20.

Figure 3:
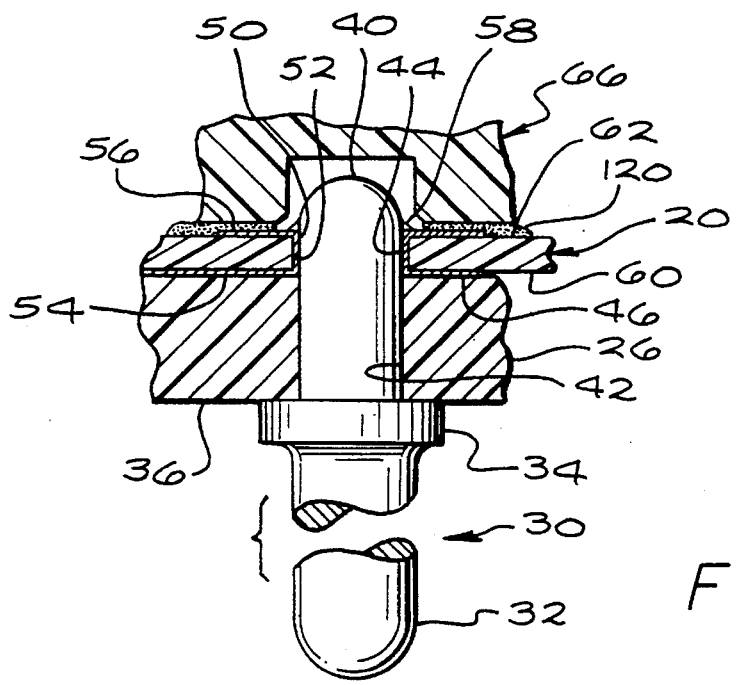
FIG. 3 is a partial enlarged sectional view of the connector of FIG. 2.

As shown in FIG. 3, each pin contact 30 has a mating part 32 extending outwardly from a flange 34 that lies against a surface 36 of a stiffening plate 26. The pin contact also includes an intermount end in the form of a stub pin 40 that projects through a hole 42 in the stiffening plate and through a plated-through hole 44 in the flexible circuit board 20. The circuit board has a conductive plating or trace forming a termination 46. The termination includes a portion 50 that plates a hole 52 in the board and ring-shaped portions 54, 56 on opposite faces 60, 62 of the board. The stub pin 40 is soldered at 58 to the termination 46, and numerous stub pins can be soldered in place simultaneously by wave soldering or other techniques. The circuit board is supported by a spacer 66 which will be described in more detail below.

Figures 4, 6:
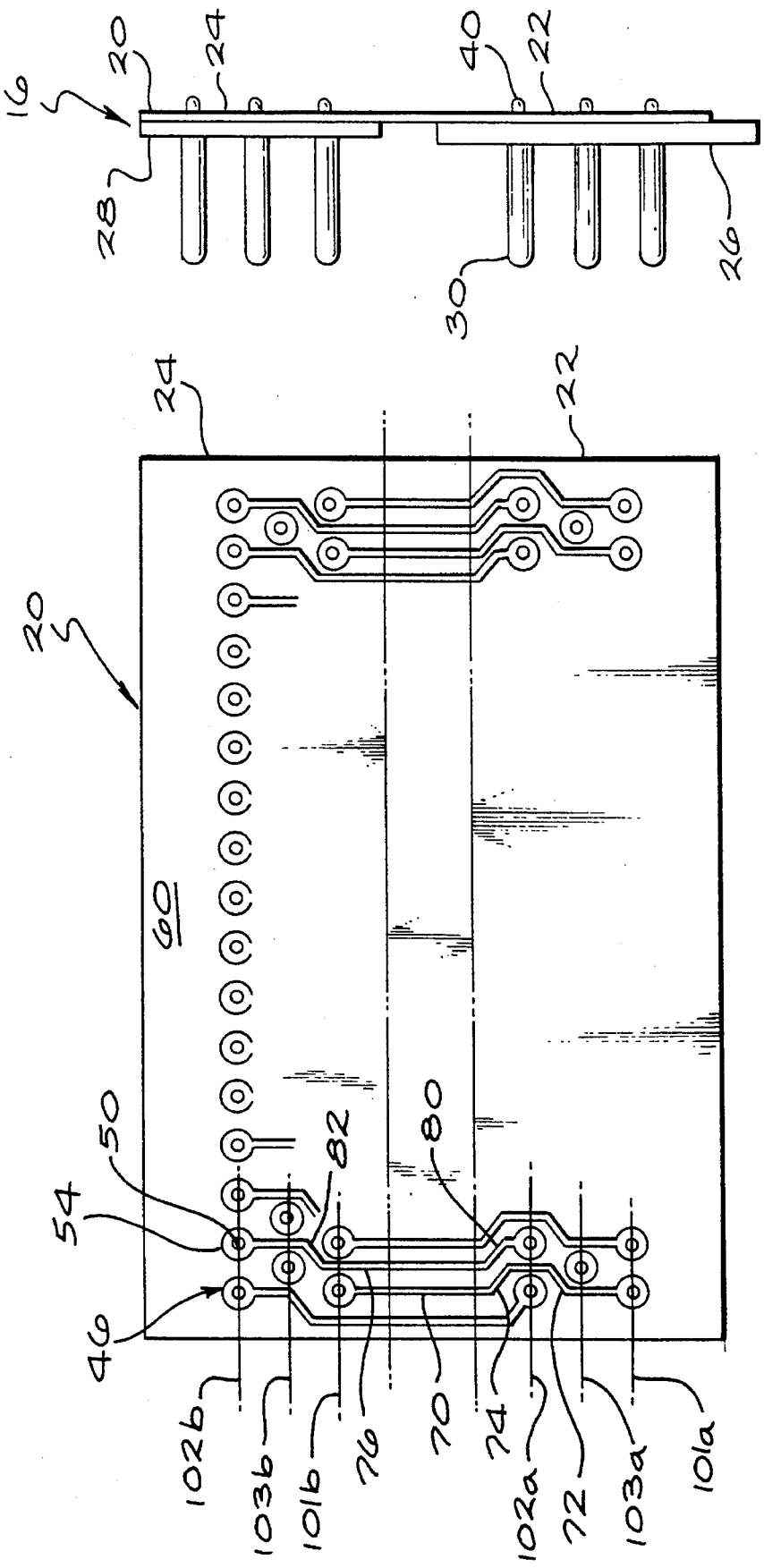
FIG. 4 is a plan view of the first face of the flexible circuit board of the circuit board assembly of FIG. 2, prior to wrapping of the board about the spacer.
FIG. 6 is an edge view of the circuit board assembly which includes the board of FIG. 4.
Figure 5:
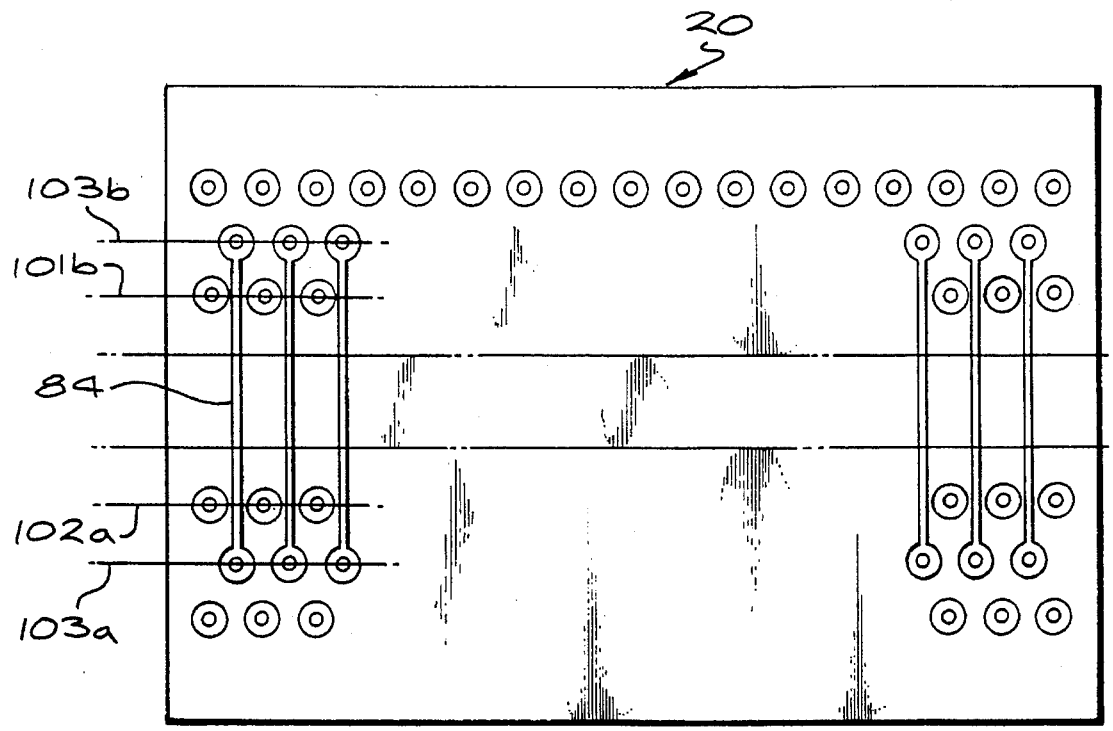
FIG. 5 is a plan view of the second face of the board of FIG. 4.

FIG. 4 shows details of the conductive traces on a first of the faces 60 of the circuit board 20. The terminations 46 of the traces include the hole plating 50 and the largely circular rings 54 around the hole. A first group of board conductors 70 connect terminations at the row 101a, to terminations at the corresponding other row 101b. It can be seen that the terminations 70 include zig-zag portions at 72, 74 which must zig-zag around the termination at row 102a (which are offset from the terminations in the other rows 101a and 102a). A second group of board conductors 76 connect terminations at the rows 102a and 102b. These conductors also have zig-zag portions 80, 82 where they extend around terminations at the row 101b and around the zig-zag portions 74 of the first group of board conductors. With the terminations along each row being closely spaced, there is barely enough room to pass a single conductor between pairs of adjacent terminations of a row. It is not practical to make the conductors thin enough and close enough together so that two of them could pass between a pair of terminations of a row. This could make connecting of the third rows of terminations 103a, 103b difficult. To make such connections, applicant constructs the circuit board as shown in FIG. 5, so that a third group of board connectors 84 extend between the third row of terminations 103a, 103b.

It can be seen that in FIG. 4, that only one conductor passes between pairs of terminations of a row, although the conductor passes in a zig-zag fashion to reach the spaces between terminations. Similarly, in FIG. 5, only a single conductor 84 passes between the terminations of rows 101b, 102a. Thus, by the arrangement shown in FIGS. 4 and 5 wherein conductive traces lie on both faces of the flexible circuit board, with the first and last rows (e.g. 101a, 102a) having their conductors on one face of the board, and with the inbetween row (e.g. 103a) having its conductors at the opposite face of the board, applicant is able to connect three rows of contacts with each pair of adjacent terminations of a row being very closely spaced with only enough room to pass a single conductor between them.

In many applications it is desirable that the distance between opposite ends 90, 92 (FIG. 2) at the opposite faces 12, 14 of the connector, be as close together as possible. Applicant accomplishes this by wrapping the flexible circuit board 20 around the spacer 66. The spacer 66 lies between the opposite end portions 22, 24 of the circuit board. The spacer has opposite substantially parallel surfaces 94, 96 and the opposite circuit board portions lie facewise against these surfaces (with only adhesive therebetween).

The spacer 66 has opposite sides 110, 112. The flexible circuit board 20 has a middle portion or middle 114 that is wrapped about the first side 110 of the spacer. The board middle 114 has an inside and outside that both extend substantially 180° about imaginary cylinders such as 116. Applicant prefers to curve the side 110 of the spacer so it is also curved substantially about a cylinder 116. This helps support all portions of the flexible circuit board to rigidize the structure. However, it is possible for the wrapped middle 114 of the circuit board to not lie facewise tightly against a side surface of the spacer. The thickness of the spacer is chosen to be the smallest thickness about which the circuit board can be wrapped without appreciable possibility of damage to the circuit board arising from its bending to a moderate radius of curvature.

The flexible circuit board 20 is preferably securely held facewise to the surfaces of the spacer 66, as with a layer of adhesive 120. The adhesive securely holds the circuit board in place on the spacer so that the combination of circuit board assembly and spacer can be handled as a unit. The adhesive also assures good support of the circuit board, and preferably all portions thereof, on the spacer. The layer of adhesive can be provided by a thin sheet of double-faced adhesive, wherein the layer of adhesive may be considered to be interrupted by a holding film between its opposite portions.

The combination 122 of circuit board assembly and spacer are mounted in a housing assembly 124 which includes a pair of hoods 126, 128 that are spaced apart by an intermediate housing portion 130.

Figure 8:
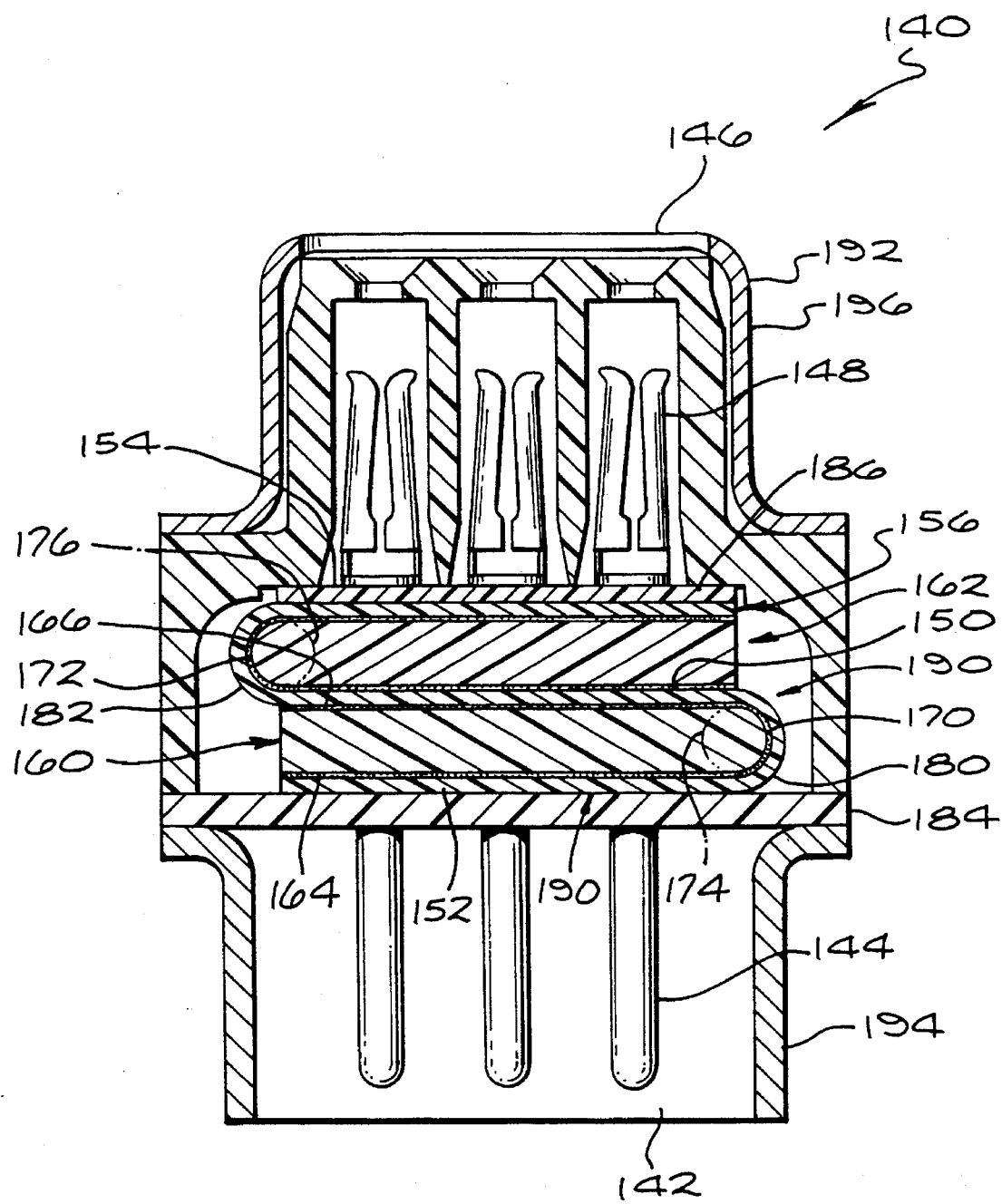
FIG. 8 is a sectional view of a connector constructed in accordance with another embodiment of the invention.
Figure 9:
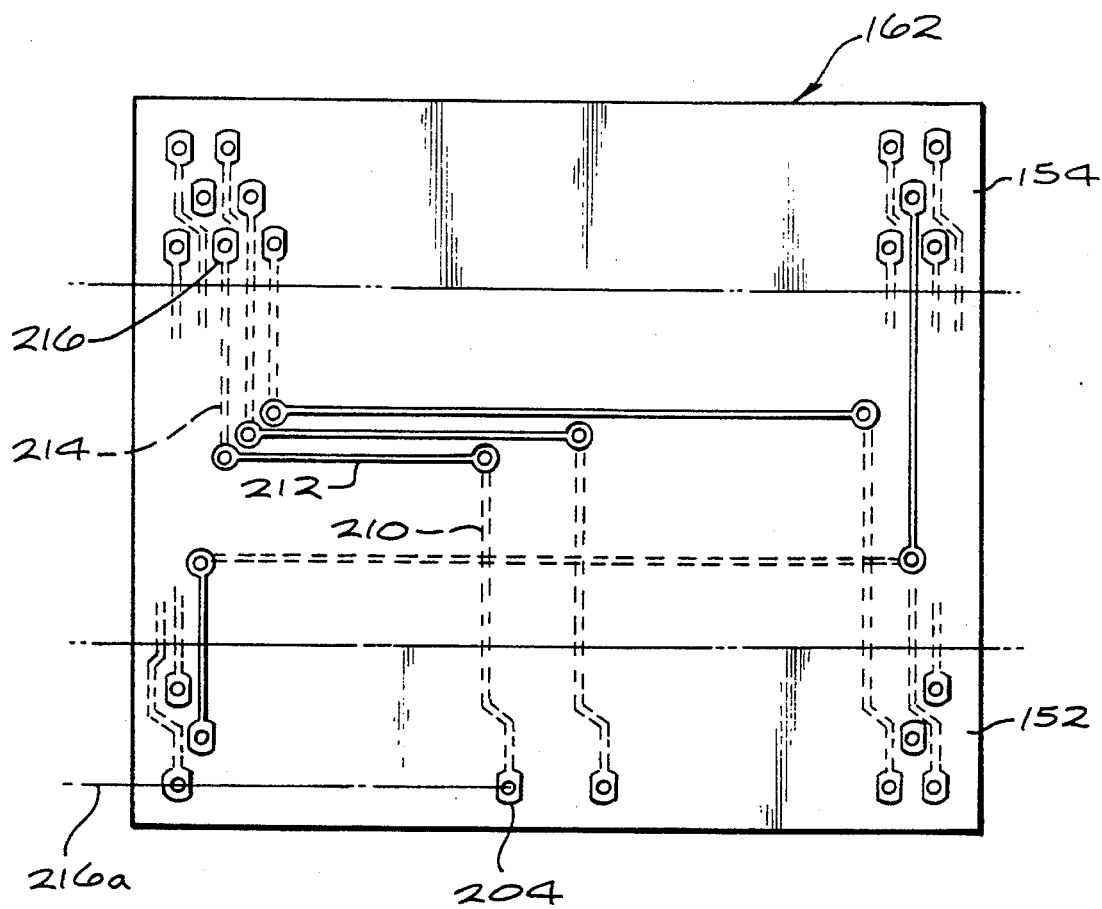
FIG. 9 is a partial plan view of the circuit board of the circuit board assembly of FIG. 8.

FIGS. 8 and 9 illustrate another connector 140 (FIG. 8) which has a first face part 142 with pin contacts 144 and a second face part 146 with socket contacts 148. This connector is constructed so any selected pin contact 144 can be connected to any one of the numerous socket contacts 148. The connector is somewhat similar to that of FIG. 1, except that the middle 150 must be of considerable length to accommodate the multiple interconnection between terminations at the first and second end portions 152, 154 of the circuit board 156. The connector includes first and second spacers 160, 162 lying between the first and second end portions 152, 154 of the circuit board, and with the circuit board middle 150 sandwiched between the two spacers. Each spacer has largely parallel first and second surfaces 164, 166 and each space has a first side 170, 172 about which a portion of the circuit board middle is wrapped. Each spacer side 170, 172 is preferably curved about 180° around an imaginary cylinder 174, 176 to form a largely U-shape in cross-section. The flexible circuit board extends in a largely S-shape that has lower and upper U-shaped loops 180, 182, with each spacer lying within each loop and maintaining a portion of the flexible board assembly in its loop shape. Of course, the connector can be used in any orientation with respect to gravity, so that terms such as upper and lower are used only to aid in understanding the invention. A stiffener plate 184, 186 is attached to each of the opposite end portions of the circuit board to form a complete circuit board assembly 190. A housing 192 which includes a pair of hoods 194, 196 and an intermediate portion 198 between them, holds the parts together.

FIG. 9 illustrates some details of the circuit board 162. In this example, one termination 204 of a first row 206a is connected by conductors 210, 212, 214 to a termination 216, with the conductors extending across opposite faces of the circuit board.

Figure 7:
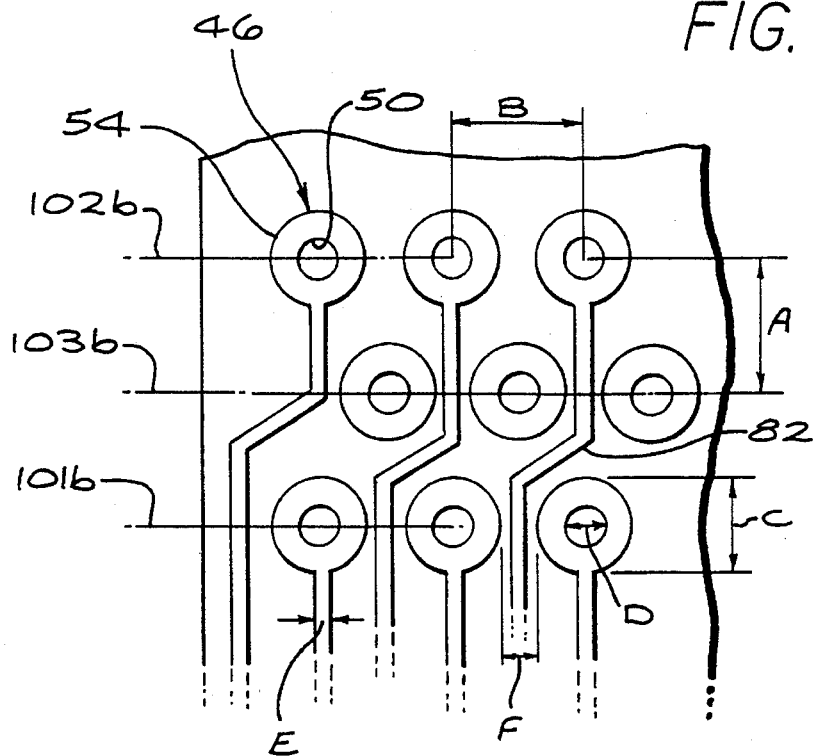
FIG. 7 is an enlarged plan view of a portion of the board of FIG. 4.

Applicant has designed a connector of the type illustrated in FIG. 2, wherein rows of contacts were spaced apart by a distance A of 0.112 inch. As indicated in FIG. 7, the contacts are spaced apart along each row by a distance B of 0.109 inch. Each termination 46 has a diameter C of about 80 mil (one mil equals one thousandth inch), with a plated-through hole of a diameter D of about 30 mil. Each conductor has a width E of about 14 mil, and the space F between adjacent terminations is about 30 mil.

Figure 10:
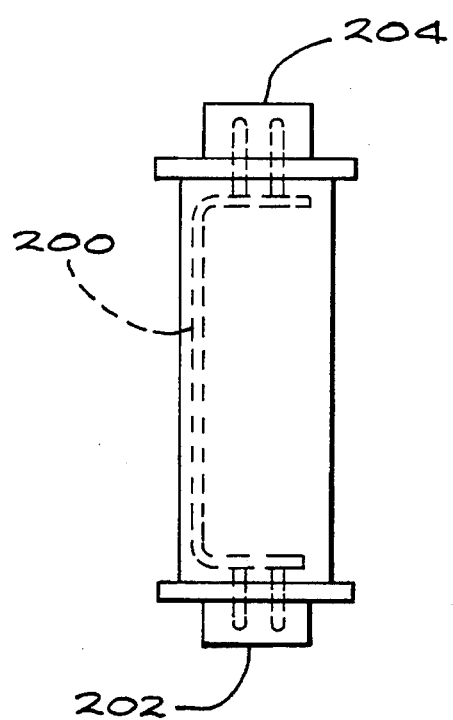
FIG. 10 is a simplified side view of a connector constructed in accordance with the prior art.

Applicant has previously sold connectors of the construction shown in FIG. 10, where a flexible circuit board 200 connected a first face 202 having 37 contacts arranged in two rows, to a second face 204 having 25 connectors arranged in two rows, with resistors on the middle portion of the circuit board.

Thus, the invention provides a connector of the type that has opposite ends or mating face parts that each have rows of contacts that are interconnected with the rows of contacts at the other face part. The connector includes a flexible circuit board assembly that includes a flexible circuit board, the board having opposite end portions connected to rows of contacts and having a middle. The opposite end portions are mounted on opposite surfaces of a spacer, while the middle is wrapped about a side of the spacer. The spacer side is preferably curved around about 180° of an imaginary cylinder, with the middle of the flexible circuit board wrapped closely thereabout. In a gender reversal connector having three rows of contacts at each face part, and corresponding terminations on the circuit board, two conductors of the circuit board extend in zig-zag paths along a first face of the board in extension between terminations at a first end portion and terminations at an opposite end portion. A third row of terminations is connected by conductors extending along a second face of the circuit board. In a connector having a custom interconnection of terminations at the opposite end portion, where the middle must be considerably longer, the flexible circuit board extends in an S-shape that includes upper and lower U-shaped portions. Each U-shaped portion extends about a separate spacer.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A connector of the type that has a first mating face part with a first plurality of rows of contacts and a second mating face part with a second plurality of rows of contacts, and a flexible circuit board assembly that extends between said mating face parts and that has first and second opposite board faces with electrically conductive terminations and multiple board conductors that each lie on a board face with said conductors connecting together a plurality of terminations at each of said mating face parts, said flexible board assembly having first and second end portions and said terminations being arranged in a plurality of rows at each end portion with each termination electrically connected to one of said contacts and to one of said board conductors, characterized by:

said first and second plurality of contacts are each arranged in at least three rows, said board conductors include first and second groups of row conductors that each extend along said first board face at each of said end portions with at least some of said conductors extending in a zig-zag pattern around some of said terminations, with only one of said conductors extending and lying between two terminations of the same row, and said board conductors include a third group of board conductors that each extend along said second board face at each of said end portions.

2. The connector described in claim 1, including:

a spacer lying between said board assembly first and second end portions, said spacer having a first side, and said flexible circuit board assembly has a middle portion lying between said board assembly end portions with said middle portion being wrapped about said first side of said spacer and said first and second end portions of said flexible circuit board assembly lying on opposite sides of said spacer.

3. The connector described in claim 2 wherein:

said first side of said spacer is convexly curved substantially around 180° of an imaginary cylinder.

4. A connector of the type that has a first mating face part with a first plurality of rows of contacts and a second mating face part with a second plurality of rows of contacts, and a flexible circuit board assembly that extends between said mating face parts and that has first and second opposite board faces with electrically conductive terminations and multiple board conductors that each lie on a board face with said conductors connecting together a plurality of terminations at each of said mating face parts, said flexible board assembly having first and second end portions and said terminations being arranged in a plurality of rows at each end portion with each termination electrically connected to one of said contacts and to one of said board conductors, characterized by:

first and second spacers lying between said board assembly first and second end portions, each spacer having largely parallel first and second surfaces and a first side curved substantially around 180° of an imaginary cylinder to form a largely U-shape in cross-section;

said flexible board assembly extending in a largely S-shape that has upper and lower U-shaped loops, with each spacer, including its first side, lying within each loop and supporting a portion of said flexible board assembly in its loop shape.

5. A connector of the type that has a first mating face part with a first plurality of rows of contacts and a second mating face part with a second plurality of rows of contacts, and a flexible circuit board assembly that extends between said mating face parts and that has first and second opposite board faces with electrically conductive terminations and multiple board conductors that each lie on a board face with said conductors connecting together a plurality of terminations at each of said mating face parts, said flexible board assembly having first and second end portions and said terminations being arranged in a plurality of rows at each end portion with each termination electrically connected to one of said contacts and to one of said board conductors, characterized by:

said flexible circuit board assembly includes a flexible circuit board and a dielectric stiffener plate at each of said end portions which is fastened facewise to said flexible circuit board, with each of said terminations comprising a plated-through hole in said flexible circuit board, with each of said stiffener plates having a plurality of holes each aligned with one of said holes in said flexible circuit;

each of a plurality of said contacts has a mount end in the form of a stub pin that projects through a hole in one of said stiffener plates and into one of said plated holes and which is electrically joined to said termination at said plated hole.

6. A connector of the type that has a first mating face part with a first plurality of rows of contacts and a second mating face part with a second plurality of rows of contacts, and a flexible circuit board assembly that extends between said mating face parts, said flexible board assembly having first and second end portions and a middle therebetween, said flexible board assembly having a plurality of rows of conductive terminations at each end portion with each termination connected to one of said contacts, and said flexible board assembly having a plurality of conductors each connecting a termination at one end portion to a termination at the other end portion, characterized by:

said middle of said flexible board assembly extends in a largely S-shape that includes upper and lower largely U-shaped loops;

a spacer having first and second opposite faces;

a second spacer device;

said lower U-shaped loop of said board assembly extending around said spacer and said upper U-shaped loop extending about said spacer device.

* * * * *